United States Patent [19]

Nakazato et al.

[11] Patent Number: 4,887,904
[45] Date of Patent: Dec. 19, 1989

[54] DEVICE FOR POSITIONING A SEMI-CONDUCTOR WAFER

[75] Inventors: Hiroshi Nakazato, Ohme; Takashi Matsumura, Yokohama; Takahiro Akamatsu, Machida; Kenji Fukui, Kawasaki, all of Japan

[73] Assignee: Canon Kabushiki Kaisha, Tokyo, Japan

[21] Appl. No.: 222,297

[22] Filed: Jul. 22, 1988

Related U.S. Application Data

[63] Continuation of Ser. No. 898,223, Aug. 20, 1986, abandoned.

[30] Foreign Application Priority Data

| Aug. 23, 1985 | [JP] | Japan | 60-183969 |
| Aug. 23, 1985 | [JP] | Japan | 60-183970 |
| Aug. 23, 1985 | [JP] | Japan | 60-183971 |
| Aug. 23, 1985 | [JP] | Japan | 60-183974 |

[51] Int. Cl.⁴ .................. G01B 11/14; G01B 11/27; B65G 47/24
[52] U.S. Cl. .................. 356/375; 198/394; 414/754; 414/757
[58] Field of Search .......... 356/138, 153, 372, 375, 356/400; 250/561; 414/754, 757; 198/394

[56] References Cited

U.S. PATENT DOCUMENTS

| 4,105,925 | 8/1978 | Rossol et al. | 250/561 |
| 4,407,627 | 10/1983 | Sato et al. | 414/757 |
| 4,423,958 | 1/1984 | Schmitt | 356/375 |
| 4,441,853 | 4/1984 | Kosugi | 414/757 |
| 4,466,073 | 8/1984 | Boyan et al. | 356/400 X |

FOREIGN PATENT DOCUMENTS 198642 12/1982 Japan .
18713 2/1983 Japan .

Primary Examiner—David Mis
Attorney, Agent, or Firm—Fitzpatrick, Cella, Harper & Scinto

[57] ABSTRACT

A device for detecting a position of an edge of a disk-like workpiece having an outer periphery whose shape includes a portion bearing positional information related to the workpiece, the device including a system for rotationally moving the workpiece; an illuminating system; and a photodetecting system; wherein the illuminating system and the photodetecting system are disposed so as to sandwich therebetween an outer peripheral portion of the workpiece when it is rotationally moved by the moving system and wherein the illuminating system projects, toward the photodetecting system, a light beam having an elongated shape in cross-section.

15 Claims, 10 Drawing Sheets

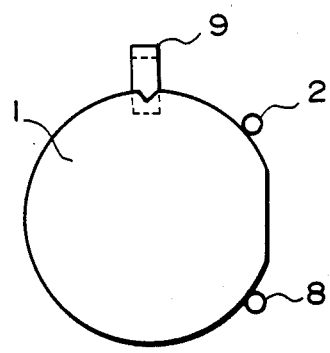
F I G. 2A
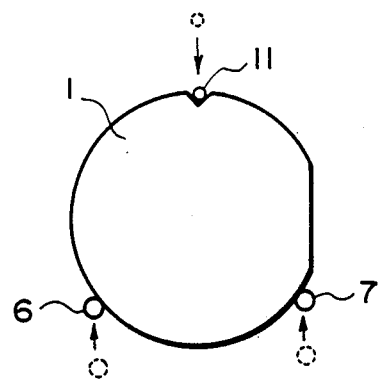
F I G. 2D
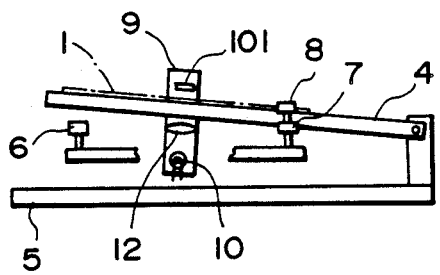
F I G. 2B
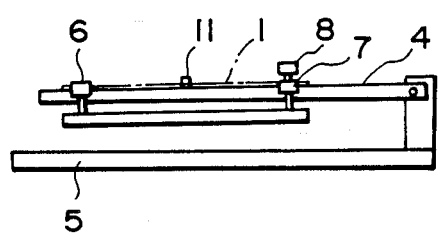
F I G. 2E
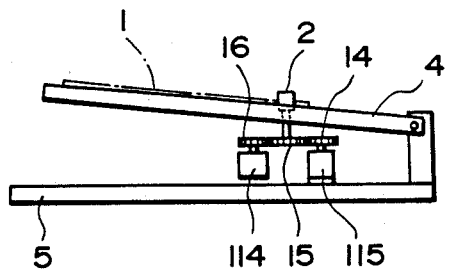
F I G. 2C

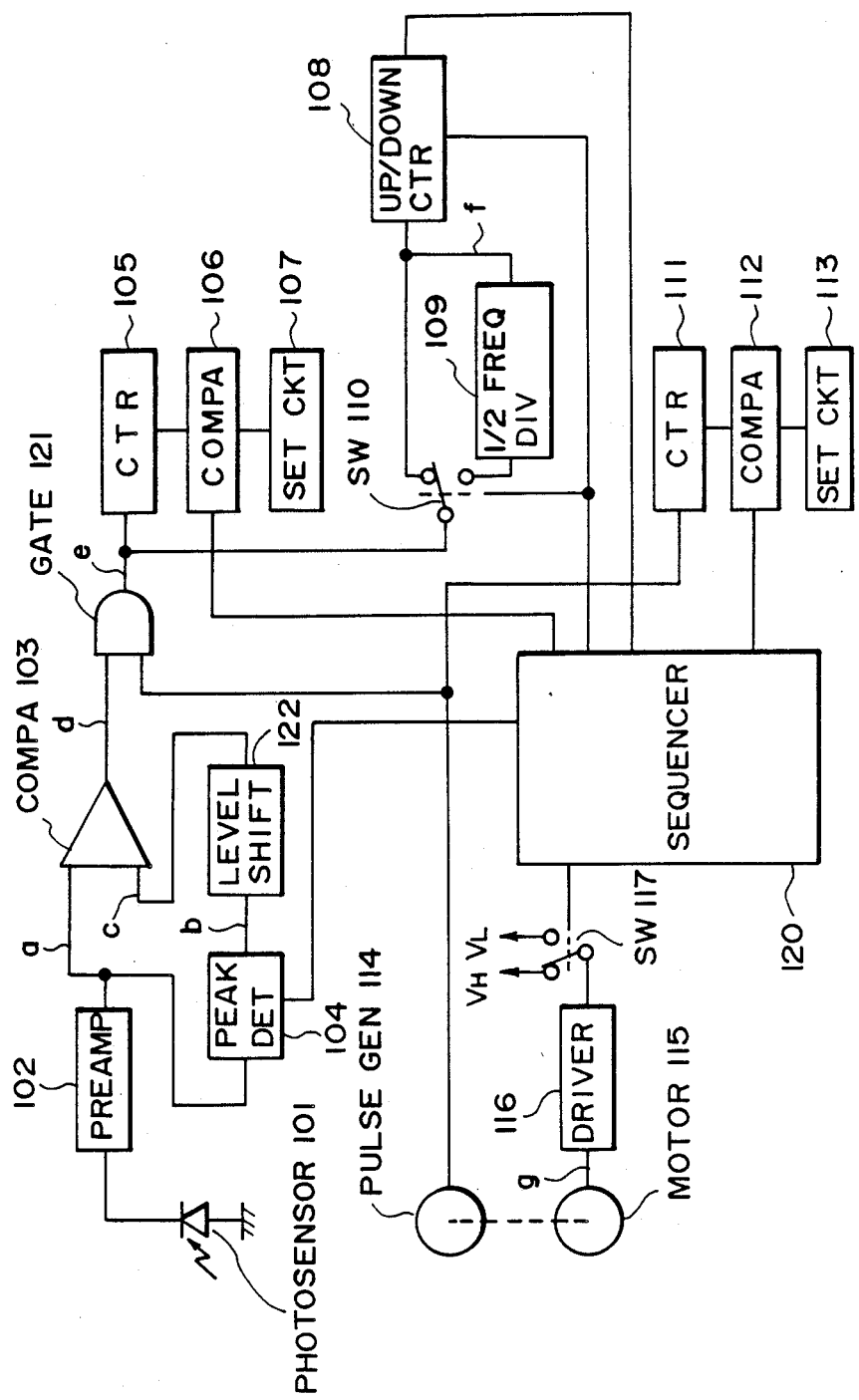
F I G. 3

DEVICE FOR POSITIONING A SEMI-CONDUCTOR WAFER

This application is a continuation of application Ser. No. 898,223 filed Aug. 20, 1986, now abandoned.

FIELD OF THE INVENTION AND RELATED ART

This invention relates to a device for positioning a workpiece and, more particularly, to a device for positioning, in a desired orientation, a disk-like workpiece such as a semiconductor wafer having a small cut-out portion The positioning device of the present invention is particularly suitably usable upon introducing semiconductor wafers into a microcircuit manufacturing exposure apparatus such as a mask aligner, a measuring apparatus or an examining apparatus such as a wafer prober, and so on.

Conventionally, the semiconductor wafers which are to be processed for the manufacture of microcircuits such as integrated circuits, each have a cut-out portion formed in its outer periphery. Such cut-out portion is used for the sake of mechanical positioning of the semiconductor wafer. Usually, the cut-out portion is provided by cutting away a portion of the circular wafer along a rectilinear line extending in parallel to the tangent of the circular periphery of the wafer. Such cut-out portion is called an "orientation flat".

A positioning device for positioning the wafer by use of the orientation flat is proposed in Japanese Laid-Open Patent Application, Laid-Open No. 18713/1983, entitled "Device for Positioning a Disk-Like Member". According to the proposed device, changes in the wafer edge position are detected with the aid of photoelectric detecting means whose output is differentiated to thereby detect the center of the orientation flat. Then, on the basis of the result of detection, the wafer is positioned. Another example of positioning device is disclosed in Japanese Laid-Open Patent Application, Laid-Open No. 198642/1982, entitled "Wafer Position Detecting Device". According to this proposal, the wafer edge position is detected with respect to each of different rotational positions of the wafer and the thus detected wafer edge positions are compared with each other, whereby an extreme value on the wafer edge position relative to the change in the rotational position is detected and whereby the wafer position is detected.

Recently, some of the wafers are formed with small V-shaped cut-out portions (hereinafter "notches"). Usually, one wafer is provided with one notch as well as one orientation flat. For these types of semiconductor wafers, the positioning devices of the above-described two examples are not able to discriminate the notch and the orientation flat from each other. As a result, the positioning of the wafer based on the notch is difficult to achieve.

A proposal has been made in an attempt to position a semiconductor wafer having a notch. According to this proposal, a positioning pin having a pair of photosensors disposed at the opposite sides of the pin is provided. The pin is pressed against the wafer and the wafer is rotated. When the pin engages with the notch, the photosensors are intercepted simultaneously by the peripheral portions of the wafer at the opposite sides of the notch, whereby the notch position is detected. In this manner, the wafer positioning is accomplished. The rotational force upon detection of the notch is applied to the wafer from two driving rollers. According to this proposal, however, all of the positioning pin and the driving rollers are pressed against the wafer when it is rotated. As a result, a strong external force is applied to the wafer, which easily results in damage of the wafer. Also, the wafer can not be rotated at high speed, which leads to prolongation of the positioning time.

SUMMARY OF THE INVENTION

It is accordingly a primary object of the present invention to provide a positioning device usable with a disk-like workpiece such as a semiconductor wafer having a minute cut-out portion formed in its outer periphery, for detecting the cut-out portion with high accuracy and without contact thereto and for positioning the disk-like workpiece with high accuracy.

It is another object of the present invention to provide a positioning device which is capable of detecting, with high accuracy, an edge of a disk-like workpiece such as a semiconductor wafer, thereby to adjust the position and/or orientation of the workpiece.

It is a further object of the present invention to provide a positioning device usable with a disk-like workpiece such as a semiconductor wafer having a minute cut-out portion formed in its outer periphery, which device is capable of accurately detecting the edge of the workpiece even when the workpiece is held stationary.

It is a still further object of the present invention to provide a positioning device usable with a disk-like workpiece such as a semiconductor wafer having a minute cut-out portion formed in its outer periphery, which device is capable of removing any eccentricity of the workpiece with respect to a center of rotation, when the workpiece is to be positioned with respect to the circumferential direction, and is capable of detecting the edge of the workpiece thereby to allow accurate positioning of the workpiece.

BRIEF DESCRIPTION OF THE DRAWINGS

FIGS. 2A–2E schematically show the manner of positioning according to the first embodiment of the present invention, wherein FIG. 2A is a plan view showing an example of positional relation of driving rollers and a cut-out detecting unit with a workpiece such as a wafer, FIGS. 2B and 2C are side views of the positioning device, FIG. 2D is a plan view showing an example of positional relation of pressing rollers and a positioning pin with the workpiece, and FIG. 2E is a side view of the positioning device which is in a final positioning state.

FIG. 3 is a block diagram showing a control system of the positioning device according to the first embodiment of the present invention.

DESCRIPTION OF THE PREFERRED EMBODIMENTS

Figure 1:
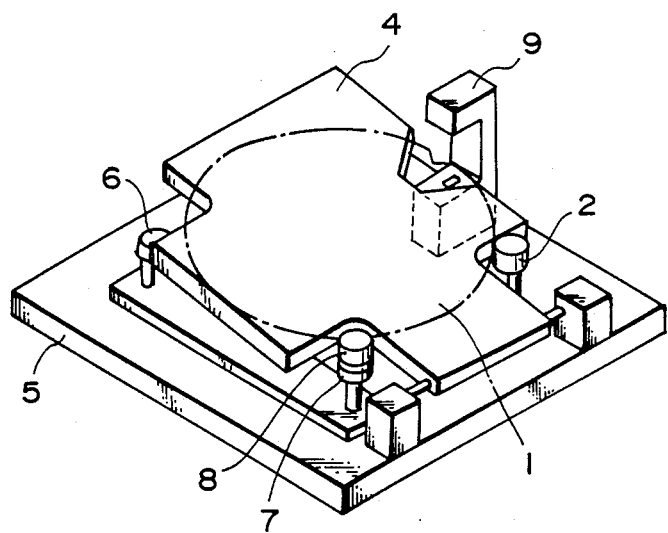
FIG. 1 is a perspective view schematically showing a positioning device according to a first embodiment of the present invention.
Figure 4:
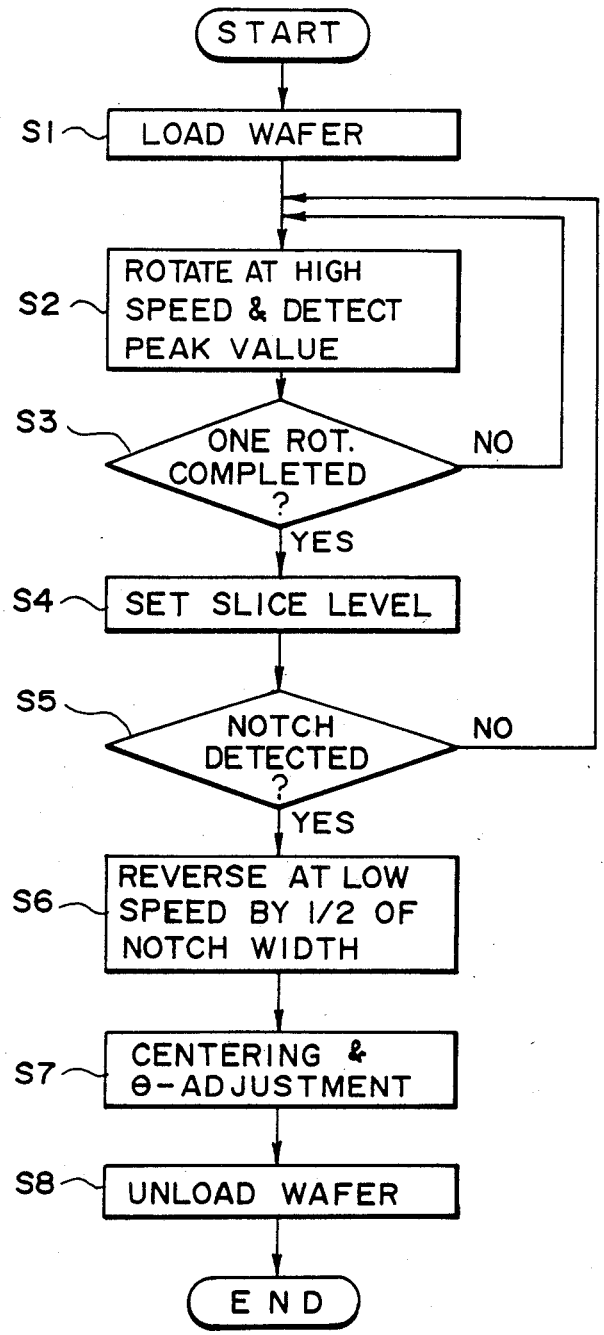
FIG. 4 is a flow chart showing an operational sequence of the positioning device according to the first embodiment of the present invention.

Referring first to FIG. 1, there is shown a positioning device according to a first embodiment of the present invention. In FIG. 1, a disk-like workpiece such as a wafer 1 has a V-shaped notch and an orientation flat (not shown) formed at respective preset positions on the outer peripheral portion thereof. The wafer 1 is placed on a wafer supporting table 4. While not shown in the drawings, the table 4 has an air-bearing mechanism for floatingly supporting the wafer 1. Also, the table 4 is tiltable about an axis defined at a side edge thereof. Denoted in this Figure by numeral 2 is a wafer driving roller; by 5, a base for supporting various components of the positioning device; and by 6 and 7, pressing rollers provided to execute final positioning of the wafer 1. The pressing rollers 6 and 7 are mounted on the base 5 for movement. More particularly, each of the pressing rollers 6 and 7 is movable inwardly so as to be pressed against the wafer 1, and also is movable outwardly so as to disengage from the wafer 1. A wafer rotation guide roller 8 is mounted on the top of the pressing roller 7. The wafer rotation guide roller 8 is adapted to engage with the wafer 1 when the table 4 is in its inclined position, thereby to rotatably hold the wafer 1 with the aid of the wafer driving roller 2. Denoted generally at numeral 9 is a cut-out sensor unit which is provided to detect the notch and/or the orientation flat of the wafer 1 and which is disposed at such location with which the notch or the orientation flat of the wafer is to be aligned.

FIGS. 2A-2E are schematic views showing the positioning device of the present embodiment. Of these Figures, FIG. 2A is a schematic plan view. In the state of FIG. 2A, the table 4 is inclined and the notch of the wafer is detected by the sensor unit 9. FIGS. 2B and 2C are schematic side views, respectively, of the positioning device which is in a state corresponding to the FIG. 2A state. Particularly, FIG. 2B illustrates details of the components in the neighborhood of the sensor unit 9, while FIG. 2C illustrates details of components in the neighborhood of the wafer driving roller 2. FIGS. 2D and 2E are a schematic plan view and a schematic side view, respectively, showing the positioning device in a state in which the detection of the notch is accomplished and the table 4 is returned to its horizontal position so that the device is prepared for the final mechanical positioning.

In FIGS. 2A-2E, denoted by numeral 10 is an illumination source; by 11, a pressing pin which functions as a final positioning pin; by 12, a condensing lens system; and by 101, a photoelectric detecting element (hereinafter "photosensor"). All of these elements are mounted on the sensor unit 9. The sensor unit 9 is made movable inwardly and outwardly. More particularly, it is moved inwardly for detection of the notch and/or the orientation flat of the wafer 1 and for pressing the wafer 1 by the positioning pin 11 for the sake of final mechanical positioning. On other occasions, the notch sensor unit 9 is moved to its outward position.

The illumination source 10 such as a lamp is provided to illuminate, from the underneath, the edge portion (peripheral portion) of the wafer 1. The photosensor 101 is disposed at an upper portion of the sensor unit 9 so as to be opposed to the light source 10. The light from the source 10 is concentrated on the lower surface of the wafer by the condensing lens system 12. In the present embodiment, the lens system 12 is arranged to shape the light, from the source 10, into one having an elongated or slit-like shape in cross-section which elongates on the wafer substantially in a radial direction with respect to the wafer 1. The longitudinal size of the photosensor 101 and the lengthwise size of the concentrated light to be partially incident on the wafer 1 (the lower surface) are determined so as to meet possible changes in the degree of light interception due to any variation in the outer diameter of the wafer and/or the passage of the notch and the orientation flat through the sensor unit 9.

As shown in FIG. 2C, the device includes a pulse generator 114 and a motor 115 which is a component of driving means for rotating the wafer 1. The motor 115 has a rotational shaft on which a gear 14 is mounted. The gear 14 is in mesh engagement with a gear 15 which is mounted on a rotational shaft of the wafer driving roller 2. That is, by actuating the motor 115, the wafer driving roller 2 is rotated. Also, the gear 15 is in mesh engagement with a gear 16 which is mounted on a rotational shaft of the pulse generator 114. Suitable parts are selected as the gears 15 and 16 and the pulse generator 114 such that, for example, one complete revolution of the wafer driving roller 2 causes the pulse generator 114 to produce six hundreds (600) pulses. Accordingly, by counting the pulses produced from the pulse generator 114, the amount of rotation of the wafer driving roller 2 and thus the amount of rotation (angle of rotation) of the wafer 1 are detectable.

FIG. 3 is a block diagram showing a control system of the positioning device according to the present embodiment. By use of the block diagram of FIG. 3, the functions of portions of the control system upon photoelectric detection of the notch of the wafer will now be described.

In response to reception of light, the photosensor 101 produces an output. The output of the photosensor 101 is amplified by a preamplifier 102. By this, changes in the quantity of incident light as detected by the photosensor 101 are converted into changes in an electric voltage. The signal outputted from the preamplifier 102 is inputted into a peak detecting circuit 104, whereby the peak value of the signal is detected. When it is detected, the peak detecting circuit 104 produces a peak-value signal which is applied to a level shifter 122. The level shifter 122 is adapted to shift down the level of the peak-value signal by a preset suitable amount, and the thus processed peak-value signal is applied to an input terminal of a comparator 103. The comparator 103 has another input terminal to which the output signal from the preamplifier 102 is directly inputted. Thus, the comparator 103 compares two input signals and produces an output signal which corresponds to the difference in level of the two signals inputted into the comparator. The function of the level shifter 122 will be described later in more detail.

The motor 115 produces a driving force for rotating the wafer driving roller 2, and, in the present embodiment, the direction and speed of rotation of the motor 115 (i.e. the direction and speed of rotation of the wafer) can be changed in two phases, i.e. a phase for high speed forward rotation and a phase for low speed reverse rotation. Changing the phase of operation of the motor 115 is effected by means of a switch 117. The rotation of the output shaft of the motor 115 is transmitted to the pulse generator 114, so that it produces pulses in accordance with the rotation of the wafer 1.

A counter 105 is provided to detect, in one aspect, the notch of the wafer 1. An AND gate 121 is provided. Under the influence of this AND gate 121, the pulses outputted from the pulse generator 114 are applied to the counter 105, to be counted thereby, only when the output signal of the comparator 103 is in a "high" level. The result of counting by the counter 105 is inputted into a comparator 106. The comparator 106 is adapted to compare the thus inputted result of counting with an upper limit value and a lower limit value which are preset in a setting circuit 107. If the result of counting by the counter 105 is within a range between the upper limit value and the lower limit value set in the setting circuit 107, it is discriminated that the wafer notch, which is the subject of the detection at this time, exists at the wafer edge portion that has just been subjected to the photoelectric detection by the photosensor 101 at the time at which the counting by the counter 105 has been made. And, in such case, the comparator 106 produces a detection signal representing this.

An up/down counter 108 is provided to detect the position of the center of the notch with respect to the peripheral direction of the wafer. The same pulses as those to be inputted into the counter 105 are applied to this up/down counter 108. More particularly, a half frequency divider 109 and switch means such as at 110 are provided. And, under the influence of the switch 110, the pulses are applied directly to the counter 108 on one occasion or those having been processed by the frequency divider 109 are applied to the counter 108 on another occasion. Also, the switching signal for the switch 110 is effective to change the counting mode of the up/down counter 108, i.e. establishing the up-counting mode or the down-counting mode. Namely, in the up-counting mode, the counter 108 counts the pulses applied thereto by way of the divider 109, while in the down-counting mode it counts the pulses directly applied thereto. As will be described later, this is for the purpose of positioning the center of the notch. The up/down counter 108 produces, in its down-counting mode, a carry signal when it counts zero.

A counter 111 is provided to detect one complete rotation of the wafer 1. The counter 111 counts the output pulses from the pulse generator 114. A setting circuit 113 is provided. In this setting circuit 113, such a value that is slightly greater than the number of pulses which are to be outputted from the pulse generator 114 in response to one complete rotation of the wafer 1, is preset. A comparator 112 compares the result of counting by the counter 111 with the set value in the setting circuit 113. If the number of pulses as counted by the counter 111 is not less than the preset value, the comparator 112 produces a detection signal representing completion of one rotation of the wafer 1.

Sequencer 120 is provided to control the system as a whole.

Figure 5:
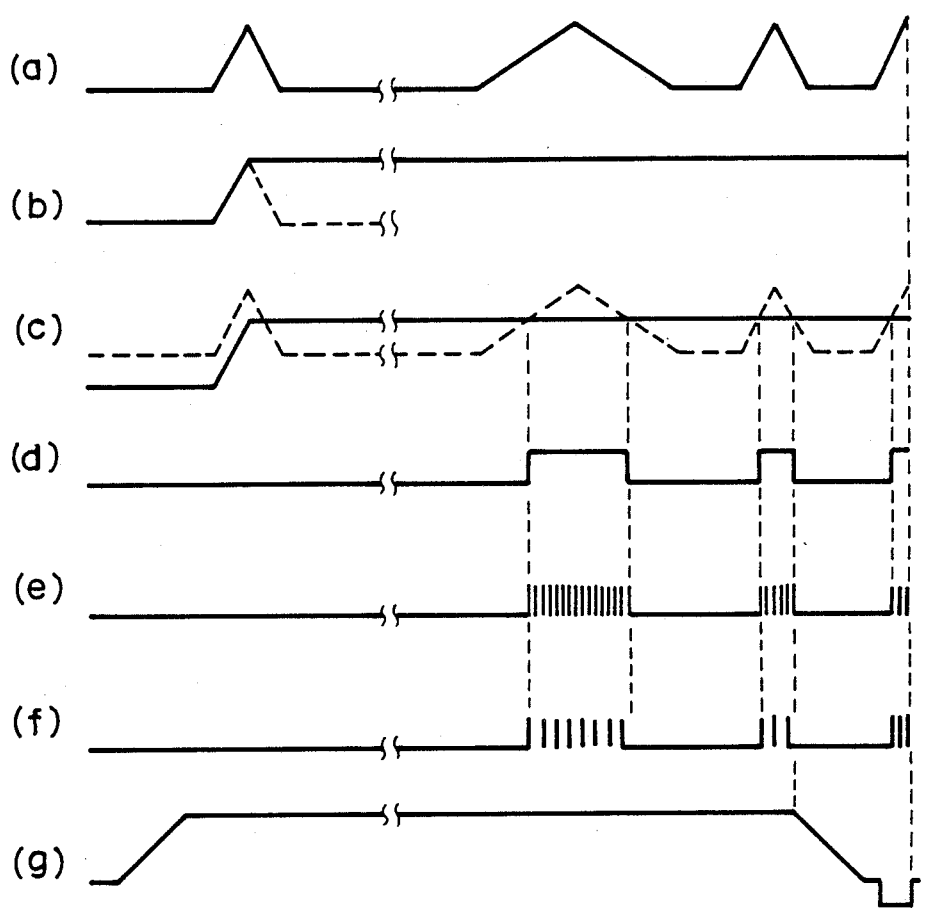
FIG. 5 is a time chart showing waveforms of signals produced at various portions of the block diagram of FIG. 3.

The manner of positioning the wafer 1 will now be described in more detail, with reference to FIGS. 1–5. Of these Figures, FIG. 5 is a time chart wherein portions (a)–(g) show changes in electric voltage which appear at points denoted in FIG. 3 by corresponding characters a–g. Hereinafter, signals at these points will be referred to as "signal a", "signal b",—"signal g". Also, in the time chart of FIG. 5, the abscissa denotes time. The abscissa thus can be regarded as an axis representing the position of the wafer in the rotational direction as long as the wafer rotates at a constant speed.

First, in operation, the table 4 is moved to its inclined position and the air-bearing unit (not shown) is actuated to discharge an air pressure over the surface of the table 4. The sensor unit 9 and the pressing rollers 6 and 7 are moved inwardly to their innermost positions, respectively. After this, the wafer 1 is conveyed and placed on the table 4. At this time, under the influence of the air-bearing unit, the wafer 1 slides on the table 4 surface toward the wafer rotation guide roller 8 and the wafer driving roller 2. When the wafer 1 engages with them, the sliding movement of the wafer 1 is stopped and the wafer is thus loaded (Step S1).

Then, the peak detecting circuit 104, the counter 105 and the up/down counter 111 are all cleared and the switch 117 is switched to its high-voltage $V_H$ side to thereby initiate high-speed rotation of the wafer 1. At this time, in order to prevent undesirable slip between the wafer 1 and the wafer driving roller 2, the actuation of the motor 115 is controlled so that it does not start and stop quickly. More particularly, a gradually increasing electric voltage is applied to the motor 115 when it starts rotation and, after elapse of a predetermined time, a constant electric voltage is applied to the motor 115. When the motor 115 is to be stopped, similarly, a gradually decreasing electric voltage is applied to the motor 115. Signal g in FIG. 5 shows the manner of voltage application to the motor 115, assuring such gradual acceleration and deceleration.

As the wafer 1 rotates, the degree of interception of light, emitted from the light source 10, by the lower surface of the wafer 1 (i.e. the quantity of light received by the photosensor 101) changes due to the presence of the notch and the orientation flat. Such change in the light quantity is converted into a change in electric signal by means of the photosensor 101. Signal a in FIG. 5 shows the output signal of the photosensor 101 as having been amplified by the preamplifier 102. In this signal a, a knife-edge peak corresponds to the notch of the wafer 1, whereas a peak having gentle slopes corresponds to the orientation flat. The signal a is processed by the peak detecting circuit 104, whereby the maximum change (i.e. the peak value) is detected (Step S2).

The pulses outputted from the pulse generator 114 in accordance with the amount of rotation of the wafer 1 are inputted into the counter 111 and counted thereby. The comparator 112 compares the count number in the counter 111 with the predetermined number set in the setting circuit 113. As described hereinbefore, such a number that is the sum of the number of the pulses which are to be outputted from the pulse generator 114 upon completion of one rotation of the wafer 1 plus an additional small number of pulses, has been preset in the setting circuit 113 as the preset number. Thus, when the wafer 1 rotates by an amount slightly greater than one complete rotation, the comparator 112 produces the detection signal representing completion of one rotation of the wafer 1, such that the sequencer 120 now detects the completion of one rotation of the wafer 1 (Step S3). In response thereto, the sequencer 120 clears again the counter 111.

At this time, the sequencer 120 stops the operation of the peak detecting circuit 104, whereby the detected peak value is held. Signal b in FIG. 5 is the output signal of the peak detecting circuit 104. The detected peak value is inputted into the level shifter 122 and the level of the peak value is shifted down by the predetermined degree. In the portion (c) of FIG. 5, the solid line depicts the peak-value signal having been subjected to the level shifting by the level shifter 122. The level-shifted peak value will be used as a slice level in the photoelectric detection of the notch (Step S4). Upon the photoelectric detection of the notch, as will be described later in more detail, the output of the photosensor 101 is first compared with the slice level (signal c in FIG. 5), such that, in accordance with the magnitude relation therebetween, the output signal of the photosensor 101 is binarized. On the basis of the pulses obtainable as a result of such binary coding, the notch and the orientation flat of the wafer 1 can be detected. It is to be noted here that the slice level for the binary coding should be so determined that the notch and/or the orientation flat can be discriminatingly detected on the basis of the pulses obtained as a result of binary coding, regardless of whether the wafer diameter is exactly regular. And, the amount of level shifting by the level shifter is determined to meet this.

If, at Step S3, it is discriminated that one rotation of the wafer 1 is not completed, the sequence goes back to Step S2 whereby detection of the peak value is continued until one complete rotation of the wafer 1 is accomplished.

The wafer 1 continues rotation and the comparator 103 compares the signal a from the photosensor 101 (depicted by a broken line in the portion c of FIG. 5) with the aforementioned slice level (signal c). The level of the output of the photosensor 101 increases beyond the slice level when the notch or the orientation flat of the wafer 1 passes through the sensor unit 9. In a time period during which the output level of the photosensor 101 is higher than the slice level, the comparator 103 produces an output signal of "high" level. Signal d in FIG. 5 depicts such output of the comparator 103. The output signal d is inputted into the AND gate 121 and it is used to control application of the output pulses of the pulse generator 114 to the counter 105 and the up/down counter 108. More specifically, only in a time period during which the notch or the orietation flat of the wafer passes underneath the photosensor 101, the output of the comparator 103 is held in the "high" level so that the AND gate 121 is opened during such time period. As a result, the pulses are applied to the counters 105 and 108 and are counted thereby. Signal e in FIG. 5 depicts the input into the counter 105.

At this time, the switch 110 is held in the divider 109 side position and the up/down counter 108 is held in the up-counting mode. Therefore, each time two pulses are outputted from the pulse generator 114, the counter 108 up-counts by "1" in response thereto. Signal f in FIG. 5 depicts the input into the up/down counter 108 on this occasion. It is seen that the number of pulses in the signal f to be counted by the counter 108 is equal to one half of the number of pulses in the signal e.

The comparator 106 compares the content of the counter 105 and the upper limit value and the lower limit value which are preset in the setting circuit 107. The upper limit corresponds to the sum of the number of pulses to be inputted into the counter 105 in response to passage of the notch underneath the photosensor 101 and a predetermined number, while the lower limit corresponds to the remainder when a predetermined number is subtracted from the aforesaid pulse number.

After the notch or the orientation flat passes underneath the photosensor 101, the AND gate 121 is closed. If, at the time, the content of the counter 105 is between the upper and lower limits set in the setting circuit 107, it is discriminated in the comparator 106 that the wafer edge just having been subjected to the photoelectric detection was the notch. And, the comparator 106 produces a detection signal representing detection of the notch, the signal being applied to the sequencer 120. By this, the sequencer 120 detects the notch (Step S5). If the comparator 112 produces a detection signal representing completion of one rotation of the wafer, before the notch is detected, it means that detection of the notch ends in failure in spite of one complete rotation of the wafer. Accordingly, the sequence goes back to Step S2. In such occasion, the slice level which has already been established may be used. If it is used, Steps S2–S4 for determining the slice level are no longer necessary. Therefore, the notch detecting operation at Step S5 is simply repeated.

When the notch of the wafer is detected at Step S5, the sequencer 120 stops the motor 115 with gradual deceleration such as shown at g in FIG. 5, thereby to stop the rotation of the wafer. Then, the switch 117 is changed to its low-voltage $V_L$ side so as to reversely rotate the motor 115 at a lower speed. That is, an electric voltage of opposite polarity is applied to the motor 115, such as shown at the righthand end portion of the signal g in FIG. 5. During this reverse rotation, the photosensor 101 detects the trailing edge of the notch (i.e. the leading edge of the notch with respect to the direction of the reverse rotation of the wafer). At this time, the switch 110 is so positioned that the output pulses from the pulse generator 114 are applied directly to the up/down counter 108, and the up/down counter 108 is in the down-counting mode. Also, at this time, the up/down counter 108 holds such a value that is equal to one half of the number of pulses having been generated in response to the passage of the notch through the sensor unit 9. Accordingly, at the time of detection of the trailing edge (the leading edge in the reverse rotation) of the notch, the up/down counter 108 starts down-counting with the output pulses of the pulse generator. When the content of the up/down counter 108 becomes zero and the carry signal is produced, the motor 115 is stopped. By this, the center of the notch is positioned exactly under the photosensor 101, i.e. at the position to be engaged by the pressing pin 11 at a later stage (Step S6).

The positioning of the notch of the wafer is accomplished in the manner described hereinbefore. If desired, mechanically pressing operation may be effected to achieve θ-positioning (positioning in rotational direction) and centering at higher accuracy.

Such mechanical pressing operation will now be described. First, after completion of the positioning of the notch described above, the wafer 1 is attracted to and fixedly held on the table 4 by vacuum suction generated by the air-bearing unit. Then, the sensor unit 9 and the pressing rollers 6 and 7 are moved outwardly. This is to prevent possible interference of these members against movement of the table 4 to its horizontal position. Thus, while holding the unit 9 and the rollers 6 and 7 at their outermost positions, the table 4 is pivotally moved to the horizontal position. After this, by moving the unit 9 inwardly, the pressing pin 11 which is mounted on the lower portion of the unit 9 is first introduced into the notch of the wafer. After completion of the introduction of the pin 11, the air is ejected again over the table 4 surface to float the wafer 1. Then, the pressing rollers 6 and 7 are pressed against the wafer 1, whereby the θ-positioning and the centering of the wafer 1 are accomplished. FIGS. 2D and 2E show such pressing operation.

Subsequently, the wafer 1 is attracted and fixedly held on the table 4 by vacuum suction and, thereafter, the pressing pin 11 and the pressing rollers 6 and 7 are moved outwardly so that they disengage from the wafer 1 (Step S7).

By this, the positioning of the wafer 1 is finished. And, the wafer 1 is conveyed to a wafer loading station in an exposure apparatus, an examining apparatus or the like, with the accuracy of positioning being maintained (Step S8).

In the present embodiment, as described hereinbefore, the slice level for the photoelectric detection is determined on the basis of the peak value of the output of the photosensor during one complete rotation of the wafer, and the output of the photosensor is binarized by the comparison with the slice level. This stably assures correct detection of the notch and/or the orientation flat even for such wafers whose external diameters are not exactly the same.

Also, discrimination of the notch and the orientation flat from each other is made by, first, counting the width of the pulse, which is obtainable as a result of binarization, using output pulses from the pulse generator 114 rotating in association with the wafer driving roller 2 and, second, by comparing the result of counting with a preset value. Since the result of counting is constant regardless of the speed of rotation of the wafer, each of the notch and the orientation flat can be independently and accurately detected.

More particularly, where such a value that corresponds to the result of counting of the pulse width related to the orientation flat is set in the setting circuit as the aforesaid preset value, the orientation flat can be easily and accurately detected independently of the notch.

In the present embodiment, high-speed rotation of the wafer continues until the notch (or the orientation flat, as desired) thereof is detected. If it is detected, the rotation of the wafer is decelerated and then stopped. Thereafter, the wafer is rotated in the reverse direction at a low speed and, at the time at which the trailing edge of the notch (the leading edge of the notch with respect to the reverse rotation of the wafer) is detected, counting of the pulses from the pulse encoder is initiated. When a predetermined number of pulses are counted, the rotation of the wafer is stopped, whereby the center of the notch is accurately positioned in place. Thus, the positioning of the wafer can be accomplished in a reduced time and, in addition thereto, any slip which might occur between the wafer and the wafer driving roller at the time of deceleration from the high-speed rotation, would not effect the accuracy of the positioning.

Figure 6:
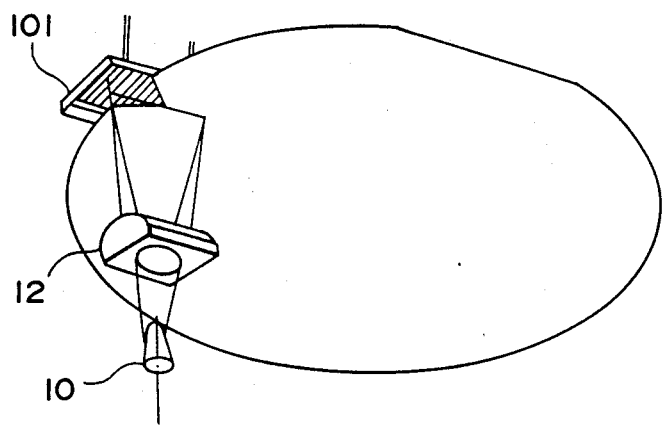
FIG. 6 is a perspective view showing a wafer edge detecting portion of a positioning device, using a cylindrical lens system, which is arranged in accordance with another embodiment of the present invention.

Further, in the present embodiment, the light emitted from the light source 10 to irradiate the wafer is concentrated or shaped by the condensing lens system 12 so that it has an elongated shape in cross-section which elongates substantially in the radial direction of the wafer. By use of such elongated light, the change in the wafer edge position can be precisely detected and, thus, high-accuracy positioning of the wafer is attainable.

Where a cylindrical lens system is used as the condensing lens system 12, the light from the light source 10 can be easily shaped into the elongated shape in cross-section. FIG. 6 shows a wafer edge detecting system of the positioning device using such cylindrical lens system as the condensing lens system 12.

In the present embodiment, a photodetector is used as the photosensor 101 for detecting the changes in the wafer edge position. The use of photodetector is, however, not indispensable, and other suitable means such as a photoarray of charge-coupled devices may be used. Also, a pulse motor may be used as the motor 115. If such pulse motor is used, the use of the pulse encoder 114 is not necessary.

Referring now to FIGS. 7–12, a positioning device according to another embodiment of the present invention will be described.

Figure 7:
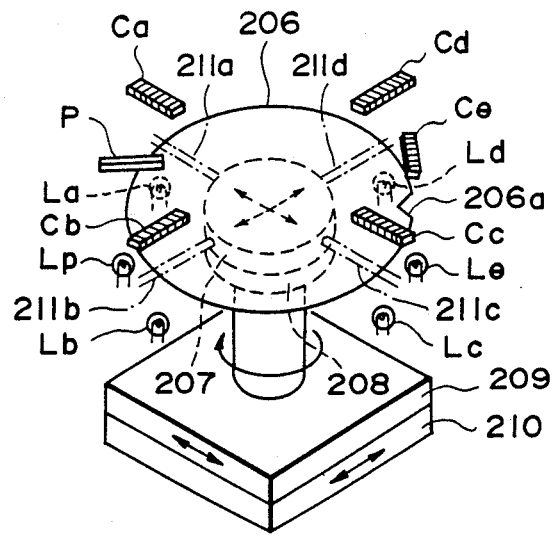
FIG. 7 is a perspective view schematically showing a positioning device according to a further embodiment of the present invention.

FIG. 7 is a perspective view of the positioning device of the present embodiment. As shown in this Figure, the device includes a rotatable support 208 and a workpiece carrying table 207 for carrying thereon a workpiece such as a wafer 206. The table 207 is releasably held by the rotatable support 208 and it is movable, when released, in X and Y directions. The device further includes a light source $L\theta$ and a linear image sensor $C\theta$ which are provided to detect a minute cut-out (hereinafter "notch") 206a formed in the outer periphery of the wafer 206. The sensor $C\theta$ is disposed in the neighborhood of the peripheral portion of the wafer 206 when it is carried on the table 207, and extends in a direction in parallel to the tangent of the wafer 206. The light source $L\theta$ is so disposed to irradiate the wafer 206 peripheral portion from underneath. Thus, the sensor $C\theta$ and the light source $L\theta$ are so disposed as to sandwich the wafer 206 therebetween. The device further includes four linear image sensors Ca, Cb, Cc and Cd and four light sources La, Lb, Lc and Ld, all of which are provided to detect eccentricity of the wafer 206, i.e. the positional deviation with respect to the X and Y directions. As has been described with reference to the foregoing embodiment, each of the light sources $L\theta$ and La–Ld is similarly provided with a cylindrical lens system so as to irradiate the lower surface of the wafer 206 with a light beam of elongated or slit-like shape in cross-section, extending in the lengthwise direction of the sensor. Of these cylindrical lens systems, only one is illustrated at $12\theta$ in FIG. 9.

Figure 9:
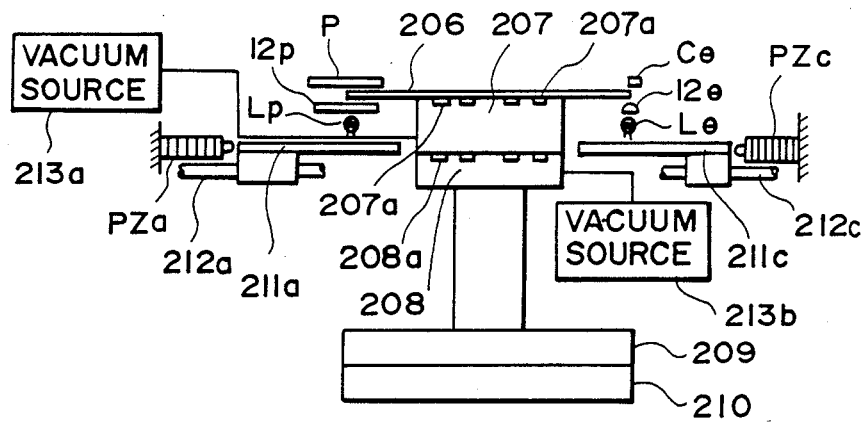
FIG. 9 is a partially sectional side view schematically and diagrammatically showing the positioning device of the FIG. 7 embodiment.

As is best shown in FIGS. 7 and 9, the wafer 206 having the notch 206a of V-shape can be held, by vacuum suction, on the table 207 having vacuum-suction grooves 207a formed on its upper surface. Also, the table 207 can be held, by vacuum suction, on the rotatable support 208 having vacuum-suction grooves 208a formed on its upper surface. The grooves 207a and the grooves 208a are in fluid-communication with respective vacuum sources 213a and 213b. By evacuating there grooves, the wafer 206 and the table 207 are attracted to and held on the table 207 and the support 208, respectively. The attracting force also may be provided by electrostatic attraction or electromagnetic attraction.

The rotatable table 208 is adapted to be rated by an unshown pulse motor. Also, the rotatable support 208 is carried on stages 209 and 210 which are made movable by suitable means in the X and Y directions, respectively, such as denoted by double-headed arrows in FIG. 7. As is best shown in FIG. 7, the sensors Ca and Cc are disposed so as to be diametrically opposed to each other with respect to the center of rotation of the rotatable support 208, while the sensors Cb and Cd are disposed so as to be diametrically opposed to each other with respect to the center of rotation of the support 208 and in a direction perpendicular to the direction from the sensor Ca to the sensor Cc. The light sources La–Ld associated with the sensors Ca–Cd, respectively, are disposed to irradiate the peripheral portion of the wafer 206 from underneath. By the combination of these sensors and the light sources, the eccentricity of the wafer 206 with respect to the center of rotation of the rotational support 208 is detected. This will be described later in more detail.

As shown in FIGS. 7 and 9, the device is further provided with a notch detecting analog type photoelectric converting element P which is disposed so as to be diametrically opposed to the sensor $C\theta$ with respect to the center of the rotational support 208. The photodetector P has an elongated shape and is disposed to extend in the radial direction as seen from FIGS. 7 and 9. Also, a light source Lp and a cylindrical lens system 12p are provided which are cooperative with the photodetector P to detect the notch 206a of the wafer 206, as will be described later.

The device further has four piezoelectric devices and four actuators, all of which are provided to correct any eccentricity of the wafer 206. More particularly, two of these piezoelectric devices as denoted at PZa and PZc in FIG. 9 and two of these actuators as denoted at 211a and 211c in FIGS. 7 and 9 are provided to precisely displace the workpiece carrying table 207 in opposite directions along the X-axis. The other two piezoelectric devices (not shown) and the other two actuators denoted at 211b and 211d in FIG. 7 are provided to precisely displace the workpiece carrying table 207 in opposite directions along the Y-axis which is perpendicular to the X-axis. Upon the positioning operation, the four piezoelectric devices are energized under the influence of a central processing unit (hereinafter "CPU") 220 shown in FIG. 8, to expand by the same distance to push the actuators 211a–211d radially inwardly with respect to the workpiece carrying table 207. By this, the actuators 211a–211d abut against the peripheral wall of the carrying table 207 to hold the same in its home position. To remove eccentricity of the wafer, as will be described later in more detail, an appropriate one of the piezoelectric devices is energized to move the associated actuator radially inwardly with respect to the carrying table 207 and, on the other hand, diametrically opposed one of the piezoelectric devices is energized to contract to thereby move its actuator radially outwardly by the same amount. By this, the position of the workpiece carrying table is adjusted. After adjustment, the piezoelectric devices are energized to contract sufficiently so that their actuators are disengaged from the carrying table 207. Similar position adjustment for the carrying table 207 is made with respect to the other of the X and Y axes. Displacement of the actuators 211a–211d are guided by four guide members, respectively, although only two of which are illustrated at 212a and 212c in FIG. 9.

Figure 8:
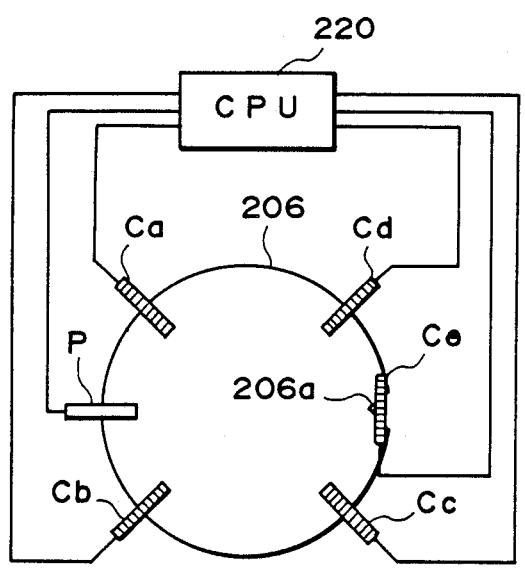
FIG. 8 is a plan view schematically and diagrammatically showing the positioning device of the FIG. 7 embodiment.

As schematically and diagrammatically illustrated in FIG. 8, all of the sensors or detectors described in the foregoing are electrically connected to the CPU 220, so that outputs of these sensors are applied to the CPU 220. Rotation of the rotatable support 208, actuation of the four piezoelectric devices, evacuating operation of the vacuum sources 213a and 23b, and movement of the stages 209 and 210, etc. are all controlled under the influence of the CPU 220.

First, in operation, the workpiece carrying table 207 is released from the rotatable support 208 and is moved, by the combination of the piezoelectric devices and the actuators, to its home position in which it is accurately aligned with the center of rotation of the rotatable support 208. Then, the grooves 208a of the rotatable support 208 are evacuated to fixedly hold the carrying table 207 on the upper surface of the rotatable support 208. Subsequently, the wafer 206 is placed on the carrying table 207 and the grooves 207a of the carrying table 207 are evacuated to fixedly hold the wafer 206 on the upper surface of the table 207 by vacuum suction. Then, the rotatable support 208 at this time supporting the table 207 and the wafer 206, is rotated by the unshown driving motor. During rotation of the wafer 206, the notch 206a is detected by the image sensor $C\theta$. When the notch 206a is detected, the rotation of the rotatable support 208 is stopped.

Figures 11A, 11B:
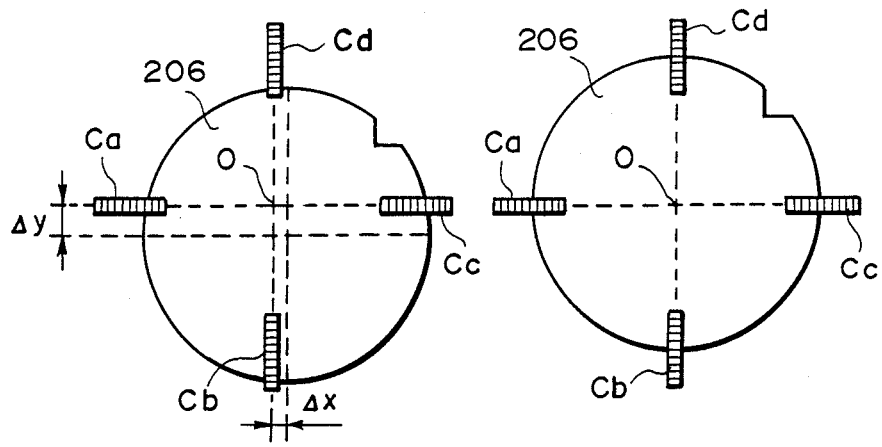
FIGS. 11A and 11B are plan views, respectively, schematically showing the manner of detecting and correcting eccentricity of a wafer, in the positioning device of the FIG. 7 embodiment.

In the state assumed at this time, there is a possibility that the wafer 206 is eccentric with respect to the center 0 of rotation of the rotatable support 208. The amount of eccentricity, if any, is detected by the four image sensors Ca–Cd which are disposed equiangularly with respect to the center of rotation of the rotatable support 208, as clearly shown in FIGS. 7 and 8. In the present embodiment, the amount of eccentricity with respect to the X direction, i.e. $\Delta x$ (see FIG. 11A), is detected from the difference between the outputs of the sensors Ca and Cc which are in a digital form, while the amount of eccentricity, if any, with respect to the Y direction, i.e. $\Delta y$, is detected from the difference between the outputs of the sensors Cb and Cd. If any eccentricity is detected, the vacuum suction force of the rotatable support 208 to the carrying table 207 is released, and the carrying table 207 which is now movable is precisely moved in accordance with the result of detection by an amount $\Delta x$ in the X direction and by an amount $\Delta y$ in the Y direction. This position adjustment is made by use of the piezoelectric devices and their actuators, as described. By this position adjustment, the eccentricity ($\Delta x$ and $\Delta y$) of the wafer 206 with respect to the center 0 of rotation of the rotatable support 208 is removed, such as shown in FIG. 11B. It will be noted that the correction of the eccentricity of the wafer 206 is attained by displacing the carrying table 207 and, thus, it is attainable without press-contact to the wafer 206. After completion of eccentricity correction, the carrying table 207 is again held on the rotatable support 208 by vacuum suction.

Figures 10A, 10B:
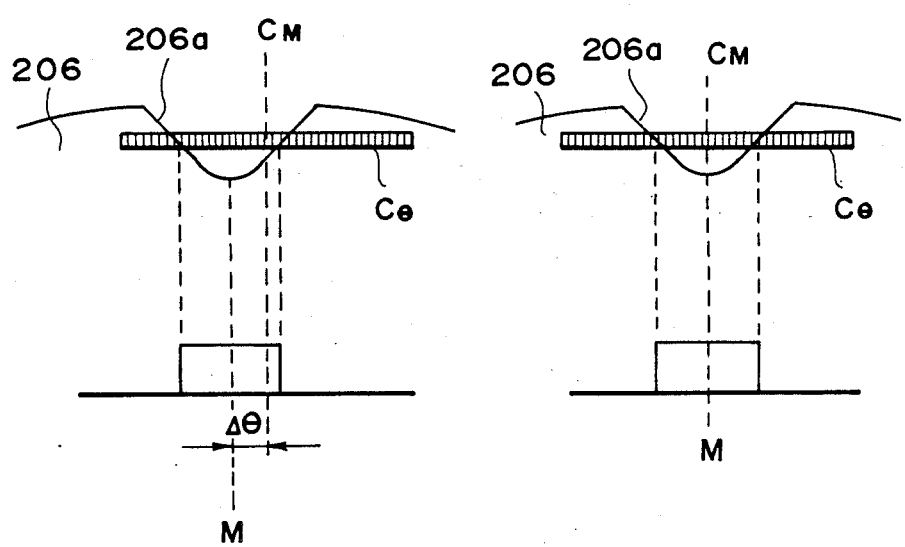
FIGS. 10A and 10B are schematic illustrations showing the relation between a minute cut-out of a wafer and a detection signal corresponding to the cut-out portion, the relation being defined during the photoelectric detecting operation of the positioning device according to the FIG. 7 embodiment.
Figure 12:
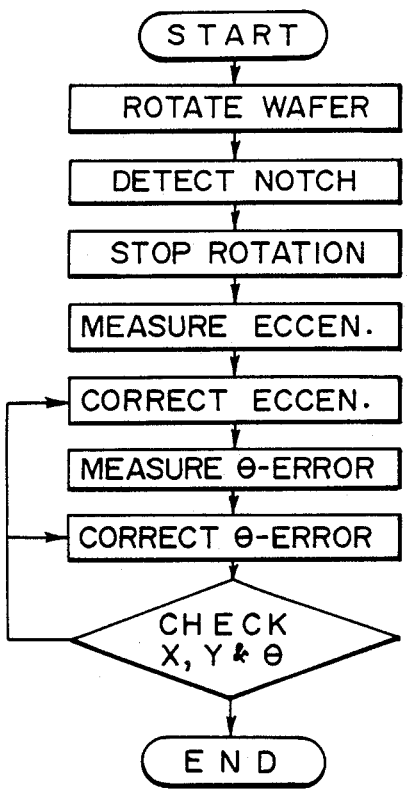
FIG. 12 is a flow chart showing the positioning operation by the device of the FIG. 7 embodiment.

Any positional deviation of the notch 206a of the wafer 206 with respect to the rotational direction is detected by the image sensor $C\theta$. This will now be described in detail with reference to FIGS. 10A and 10B. First, positional deviation $\Delta\theta$ of the center M of the light passed through the notch 206a (i.e. not intercepted by the wafer edge portion) with respect to the central picture element CM (which is predetermined) of the linear image sensor $C\theta$ is detected (FIG. 10A) while maintaining the wafer 206 stationary. Then, the rotatable support 208 is rotated by an amount corresponding to the rotational deviation $\Delta\theta$, whereby the center M of the light passed through the notch 206a becomes exactly coincident with the central picture element CM (FIG. 10B). By this, the positional deviation in the rotational direction is corrected accurately. The steps of the above-described positioning operation are illustrated in FIG. 12 in the form of a flow chart.

While, in the present embodiment, the rotation of the wafer is stopped when the linear image sensor $C\theta$ detects the notch 206a of the wafer, this may be modified. That is, the device of the present embodiment is provided with the analog photoelectric converting element P, as described, which is diametrically opposed to the linear image sensor $C\theta$. And, in operation, the wafer 206 may be rotated at high speed until the notch 206a of the wafer 206 is detected by the photoelectric converting element P. From the point of time when the output of the photoelectric converting element P changes with the passage of the notch 206a, the wafer 206 is rotated by an angle of 180 degrees and is stopped. By this, the notch 206a of the wafer 206 is placed with certainly at the point of detection by the linear image sensor $C\theta$. By doing so, the time required for positioning the wafer with respect to the rotational direction can be reduced.

It is to be noted that, by using the outputs of the linear image sensors Ca-Cd after correction of the eccentricity of the wafer 206, the diameter or radius of the wafer 206 can be measured exactly. This is very advantageous. That is, the capability of measuring the wafer radius allows use of the positioning device of the present invention together with one or more different type positioning devices, for handling the same wafer in different stages of the semiconductor device manufacturing process, regardless of whether the radius of the wafer is exactly of regulation size. This will now be described in detail, taken in conjunction with FIG. 13.

Denoted in this Figure by character Wref is a reference wafer having a standard or reference radius R1; and by W, a wafer whose radius R2 contains an error with respect to the reference radius R1. In the illustrated example, R2>R1. Denoted at PP1, PP2 and PP3 are positioning pins provided in a positioning device of the type in which wafer positioning is executed on the basis of an outer peripheral edge of the wafer. By abutting a circumferential portion and an orientation flat of the wafer against these positioning pins, the wafer positioning is accomplished. If a wafer being handled has a dimension exactly the same as that of the reference wafer Wref, then, after the positioning, the same positional state is attainable as a result of positioning, at the time when the wafer is introduced into (e.g.) a semiconductor device manufacturing exposure apparatus, irrespective of whether the positioning is executed by use of the positioning device of the present invention (based on centering) or by use of the positioning device of illustrated type (based on wafer peripheral edge). If, however, the wafer W whose radius R2 is not equal to the reference radius R1, is to be handled, the situation differs.

Figure 13:
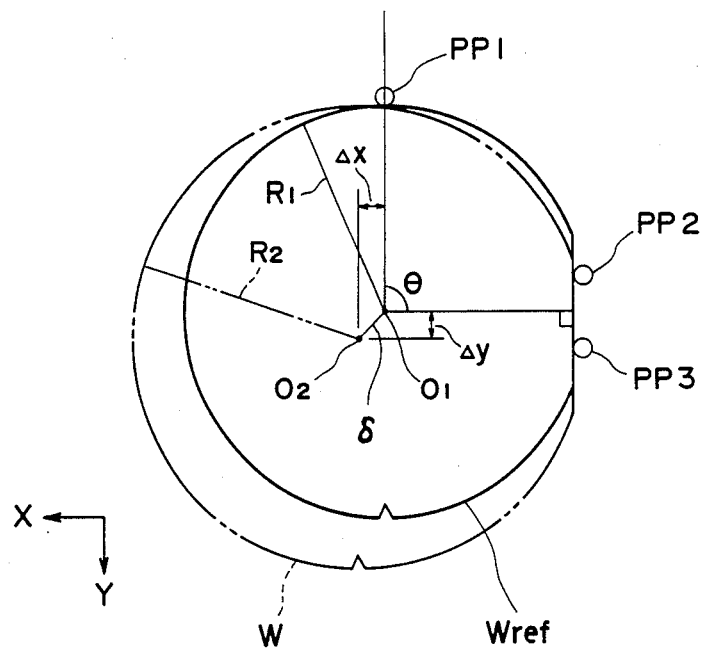
FIG. 13 is a schematic illustration showing positional deviation of a center of a wafer whose radius is not exactly of a regulation size, the deviation appearing when the wafer is positioned while relying on the peripheral edge thereof.

It is seen from FIG. 13 that, when the wafer W is positioned by use of the positioning pins PP1-PP3, the center of the wafer W denoted at 02 deviates from the center 01 of the reference wafer Wref, as it is similarly positioned, by an amount denoted at $\delta$ in this Figure. If, as compared therewith, the wafer W is positioned by the positioning device of the present invention, based on the centering, the center 02 of the wafer W upon completion of the positioning fixedly coincides with the center 01 of the reference wafer Wref since the positioning reference is the center of the wafer being handled. From this, it follows that, if in the exposure apparatus the circuit patterns are photoprinted on the wafer W having been positioned by the positioning pins PP1-PP3 and when such wafer W is subsequently handled by the positioning device of the present invention and introduced again into the exposure apparatus, the position of the center 02 of the wafer W assumed at the time of the aforesaid subsequent introduction (the position corresponding to the point 01 in FIG. 13) deviates from the position of the center 02 of the wafer W assumed at the time of the first introduction of the wafer W into the exposure apparatus, by the amount $\delta$.

In order to obviate this, according to the present embodiment, the X-stage 209 and/or the Y-stage 210 is driven after correction of the eccentricity of the wafer (i.e. centering) thereby to shift the wafer position by an amount corresponding to the deviation $\delta$. More specifically, in FIG. 13, an angle $\theta$ defined between a line passing through the center 01 of the reference wafer Wref and the positioning pin PP1 and a line extending from the center 01 and intersecting selecting the orientation flat of the wafer at a right angle, is determined. Therefore, the deviation $\delta$ (= $\Delta x$, $\Delta y$) is detectable from the radius error (= R2 − R1) of the wafer W. Thus, on the basis of the information concerning the radius of the wafer W obtainable from the image sensors Ca-Cd, calculation is made to detect the difference or deviation ($\delta$ = $\Delta x$, $\Delta y$) between the reference position defined by the positioning reference in the device of the present invention (i.e. the center 02 of the wafer W) and the reference position defined relative to the wafer W by the positioning device using the wafer pheripheral edge (i.e. the center 01 of the reference wafer). And, in accordance with the result of calculation, the stages 209 and 210 disposed under the rotational support 208 are displaced. This allows use of the positioning device of the present invention with different types of positioning devices.

While, in the present embodiment, the linear image sensors Ca-Cd detect the eccentricity of the wafer, they may be replaced by analog type photoelectric converting devices. However, use of the linear image sensors is preferable because they are not effected by changes, with time, in the quantity of light from the light sources. It is a possible alternative that a suitable lens system may be disposed between each of the linear image sensors and the upper surface of the wafer so as to form an image of the wafer edge portion at an enlarged magnification. By doing so, further improvement in the position detection accuracy is attainable.

While the invention has been described with reference to the structures disclosed herein, it is not confined to the details set forth and this application is intended to cover such modifications or changes as many come within the purposes of the improvements or the scope of the following claims.

What is claimed is:

1. A device for detecting a position of an edge of a disk-like workpiece having an outer periphery whose shape includes a portion bearing positional information related to the workpiece, said device comprising:
   driving means for rotationally moving the workpiece;
   illuminating means; and
   photodetecting means having an elongated light receiving surface;
   wherein said illuminating means and said photodetecting means are disposed so as to sandwich therebetween an outer peripheral portion of the workpiece when it is rotationally moved by said driving means and wherein said illuminating means projects, toward said photodetecting means, a light beam having an elongated shape in cross-section and wherein the direction of elongation of the shape of the light beam substantially agrees with the direction of elongation of said light receiving surface of said photodetecting means.

2. A device according to claim 1, wherein said illuminating means projects the light beam so that the cross-sectional shape of the light beam elongates substantially in a radial direction of the workpiece.

3. A device according to claim 1, wherein said illuminating means projects the light beam so that the cross-sectional shape of the light beam elongates in a direction substantially parallel to a tangential direction of the workpiece.

4. A device according to claim 1, wherein said illuminating means has a light source and a cylindrical lens system.

5. A device for positioning a disk-like workpiece having an outer periphery whose shape includes a portion bearing positional information related to the workpiece, said device comprising:
   a table for carrying thereon the workpiece;
   driving means for releasably holding said carrying table and for rotationally moving said carrying table;
   means for detecting an amount of eccentricity of the workpiece when it is carried on said carrying table, with respect to a center of rotation by said driving means; and
   means for displacing said carrying table relative to said driving means, on the basis of the result of detection by said detecting means.

6. A device according to claim 5, further comprising means for controlling said driving means on the basis of a change in position of an edge of the workpiece, rotated by said driving means, with respect to a predetermined location.

7. A device for positioning a disk-like workpiece having an outer periphery whose shape includes a portion bearing positional information related to the workpiece, said device comprising:
   driving means for rotationally moving the workpiece, said driving means having a holding portion for holding the workpiece and a rotatable portion for supporting said holding portion;
   means for detecting an amount of eccentricity of the workpiece when it is held by said holding portion, with respect to the rotation by said driving means;
   means for displacing said holding portion relative to said rotatable portion on the basis of the detection by said detecting means, to thereby remove the eccentricity of the workpiece;
   means for detecting a position of said portion of the workpiece, when the workpiece is rotationally moved by said driving means after correction of the eccentricity of the workpiece; and
   means for controlling said driving means on the basis of the detection by the second-mentioned detecting means.

8. A device for positioning a disk-like workpiece having an outer periphery whose shape includes a cut-out portion bearing positional information related to the workpiece, said device comprising:
   means for rotating the workpiece;
   first controlling means, having a first sensor, for detecting the cut-out portion of the workpiece when it is rotated by said rotating means, said first controlling means controlling said rotating means on the basis of the detection of the cut-out portion to relatively roughly position the workpiece; and
   second controlling means, having a second sensor adapted to be disposed in a predetermined angular relationship with said first sensor with respect to a center of rotation defined by said rotating means, for detecting the cut-out portion of the workpiece, after it is positioned by said first controlling means, said second controlling means controlling said rotating means on the basis of the detection thereby so as to relatively finely position the workpiece.

9. A device for angularly positioning a disk like workpiece having a V-shaped notch, said device comprising:
   a rotatable table;
   detecting means for detecting a position of the V-shaped notch formed in the workpiece, said detecting means includes linear image sensor, having a plurality of arrayed sensing elements, and a light source disposed so as to sandwich therebetween a peripheral portion of the workpiece when it is carried on said rotatable table, said linear image sensor being disposed in a direction substantially parallel to a tangential direction of the workpiece; and
   means for controlling rotation of said rotatable table such that a center of the V-shaped notch of the workpiece is aligned with a predetermined sensing element of said linear image sensor.

10. A device for angularly positioning a disk-like workpiece having a V-shaped notch, said device comprising:
   a rotatable table;
   detecting means for detecting the V-shaped notch formed in an outer periphery of the workpiece, said detecting means including a linear image sensor, having a plurality of picture elements, and a light sensor disposed so as to be sandwich therebetween a peripheral portion of the workpiece, when it is carried on said rotatable table, and in a direction substantially parallel to a tangential direction of the workpiece;
   means for controlling rotation of said rotatable table so that a center of the V-shaped notch of the workpiece is aligned with a predetermined picture element of said linear image sensor;
   an analog photoelectric converting element and a light source which are disposed in the neighborhood of the outer periphery of the workpiece and disposed so as to sandwich therebetween the workpiece; and means responsive to an output of said photoelectric converting element, to stop rotation of said rotatable table when the V-shaped notch of the workpiece enters a field of detection of said linear image sensor.

11. A device for positioning a disk-like workpiece having a V-shaped notch, said device comprising:
a rotatable support;
a carrying table releasably held by said rotatable support, said carrying table, when released, being movable in X and Y directions;
a photoelectric converting element and a light source cooperative to detect positional deviation of the workpiece when it is carried on said carrying table, with respect to the X and Y directions, said photoelectric converting element and said light source being disposed so as to sandwich the workpiece therebetween at least at a point in the neighborhood of the outer periphery of the workpiece carried on said carrying table;
a linear image sensor, having a plurality of picture elements, and a light source cooperative to detect the position of the V-shaped notch of the workpiece, said linear image sensor and said light source cooperative therewith being disposed in the neighborhood of the outer periphery of the workpiece carried on said carrying table and disposed in a direction substantially parallel to a tangential direction of the workpiece and sandwiching the workpiece therebetween; and
means for controlling rotation of said rotatable support so that a center of the V-shaped notch of the workpiece is aligned with a predetermined picture element of said linear image sensor.

12. A device according to claim 11, wherein said photoelectric converting element comprises a linear image sensor.

13. A device for positioning a disk-like workpiece having a V-shaped notch in the outer periphery thereof, said device comprising:
a rotatable table;
a carrying table releasably held by said rotatable table, said carrying table, when released, being movable in X and Y directions;
at least a pair of linear image sensors and a light source cooperative to detect positional deviation of the workpiece in the X and Y directions when the workpiece is carried on said carrying table, said linear image sensor and said light source being disposed in the neighborhood of the outer periphery of the workpiece and disposed so as to sandwich the workpiece therebetween;
a linear image sensor, having a plurality of picture elements, and a light source cooperative to detect the V-shaped notch, said V-shaped notch detecting linear image sensor and said light source cooperative therewith being disposed in the neighborhood of the outer periphery of the workpiece and in a direction substantially parallel to a tangential direction of the workpiece, so as to sandwich the workpiece therebetween;
means for controlling rotation of said rotatable table so that a center of the V-shaped notch of the workpiece is aligned with a predetermined picture element of said linear image sensor;
an analog photoelectric converting element and a light source disposed in the neighborhood of the workpiece and disposed so as to sandwich the workpiece therebetween; and
means responsive to an output of said photoelectric converting element, to stop rotation of said rotatable table when the V-shaped notch of the workpiece enters a field of detection of said V-shaped notch detecting linear image sensor.

14. A device for positioning a disk-like workpiece having a minute cut-out portion in the outer periphery thereof, said device comprising:
a table for carrying thereon the workpiece;
means for rotating the workpiece carried on said table;
means, having an elongated light receiving surface, for optically detecting the minute cut-out portion formed in the outer periphery of the workpiece; and
means for positioning the detected cut-out portion of the workpiece at a predetermined location;
wherein said optically detecting means includes means for irradiating the outer peripheral portion of the workpiece with a light beam having an elongated shape in cross-section which is elongated substantially in a radial direction with respect to the workpiece and wherein the direction of the elongation of the light beam substantially agrees with the direction of elongation of said light receiving surface of said optically detecting means, and means for detecting a change in quantity of light due to a change in position of the outer periphery of the workpiece, when the outer peripheral portion of the workpiece is irradiated with the light from said irradiating means.

15. A device according to claim 14, wherein said irradiating means includes a light source for producing the light beam and a cylindrical lens system.

* * * * *

UNITED STATES PATENT AND TRADEMARK OFFICE
CERTIFICATE OF CORRECTION

PATENT NO. : 4,887,904

DATED : December 19, 1989

INVENTOR(S) : HIROSHI NAKAZATO ET AL.

Page 1 of 2

It is certified that error appears in the above-identified patent and that said Letters Patent is hereby corrected as shown below:

ON TITLE PAGE ITEM [54]

"SEMI-CONDUCTOR WAFER" should read
--SEMICONDUCTOR WAFER--.

COLUMN 1

Line 3, "SEMI-CONDUCTOR WAFER" should read
--SEMICONDUCTOR WAFER--.
Line 14, "portion" should read --portion.--.
Line 22, "have" should read --has--.

COLUMN 4

Line 52, "six hundreds (600) pulses." should read
--six hundred (600) pulses.--.

COLUMN 11

Line 10, "there" should read --these--.
Line 15, "rated" should read --rotated--.

COLUMN 12

Line 12, "are" should read --is--.

COLUMN 13

Line 35, "certainly" should read --certainty--.

UNITED STATES PATENT AND TRADEMARK OFFICE
CERTIFICATE OF CORRECTION

PATENT NO. : 4,887,904

DATED : December 19, 1989

INVENTOR(S) : HIROSHI NAKAZATO ET AL.

It is certified that error appears in the above-identified patent and that said Letters Patent is hereby corrected as shown below:

COLUMN 14

Line 37, "selecting" should be deleted.

COLUMN 16

Line 32, "disk like" should read --disk-like--.
    Line 57, "be sandwich" should read --be sandwiched--.

Signed and Sealed this

Fifth Day of November, 1991

Attest:

HARRY F. MANBECK, JR.

Attesting Officer

Commissioner of Patents and Trademarks